(12) United States Patent
Barbieri et al.

(10) Patent No.: US 11,484,910 B2
(45) Date of Patent: Nov. 1, 2022

(54) NEGATIVE IMPEDANCE CIRCUIT AND CORRESPONDING DEVICE

(71) Applicant: STMicroelectronics S.r.l., Agrate Brianza (IT)

(72) Inventors: Andrea Barbieri, Casalpusterlengo (IT); Aldo Vidoni, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 349 days.

(21) Appl. No.: 16/747,197

(22) Filed: Jan. 20, 2020

(65) Prior Publication Data

US 2020/0230648 A1 Jul. 23, 2020

(30) Foreign Application Priority Data

Jan. 21, 2019 (IT) .................. 102019000000883

(51) Int. Cl.
*H03H 11/52* (2006.01)
*B06B 1/02* (2006.01)
*B06B 1/06* (2006.01)
*H03F 3/45* (2006.01)

(52) U.S. Cl.
CPC .............. *B06B 1/0223* (2013.01); *B06B 1/06* (2013.01); *H03F 3/45475* (2013.01); *H03H 11/52* (2013.01); *H03F 2200/129* (2013.01); *H03F 2200/156* (2013.01); *H03F 2203/45116* (2013.01)

(58) Field of Classification Search
CPC ..... B06B 1/0223; B06B 1/06; H03F 3/45475; H03F 2200/129; H03F 2200/156; H03F 2203/45116; H03F 2200/222; H03F 2200/369; H03F 2203/45676; H03F 3/45183; H03F 1/56; H03H 11/52

See application file for complete search history.

(56) References Cited

U.S. PATENT DOCUMENTS

| 5,767,722 | A | 6/1998 | Kasha et al. |
| 2003/0234684 | A1 | 12/2003 | Oppelt |
| 2013/0038409 | A1* | 2/2013 | Cooney .................. H03H 11/48 333/213 |

FOREIGN PATENT DOCUMENTS

JP S62130012 A 6/1987

* cited by examiner

*Primary Examiner* — Jung Kim
(74) *Attorney, Agent, or Firm* — Slater Matsil, LLP

(57) ABSTRACT

A negative impedance circuit includes: a differential circuit stage; a positive feedback path from an output of the differential circuit stage to a first input of the differential circuit stage; and a negative feedback path from the output of the differential circuit stage to a second input of the differential circuit stage. The negative feedback path includes a first transistor, and a unitary gain path from the output of the differential circuit stage to the second input of the differential circuit stage, the unitary gain path coupled to ground via a reference impedance. The positive feedback path includes a second transistor. The first and second transistors are coupled in a current mirror arrangement and have respective control electrodes configured to be driven by the output of the differential circuit stage, where the negative impedance circuit causes a negative impedance at the first input of the differential circuit stage.

20 Claims, 4 Drawing Sheets

NEGATIVE IMPEDANCE CIRCUIT AND CORRESPONDING DEVICE

CROSS-REFERENCE TO RELATED APPLICATIONS

This application claims priority to Italian Patent Application No. 102019000000883, filed on Jan. 21, 2019, which application is hereby incorporated herein by reference.

TECHNICAL FIELD

The present disclosure relates generally to an electronic system and method, and, in particular embodiments, to a negative impedance circuit and corresponding device.

BACKGROUND

Various types of analog circuits benefit from the possible use of negative impedance circuits.

Also, various types of arrangements are known and adopted for providing negative impedance circuits.

Circuits jointly adopting positive and negative feedback are exemplary of such arrangements: for instance, so-called negative capacitance converters are known wherein a high negative capacitance may be implemented in a process involving low-density capacitors.

These known arrangements may exhibit limitations related, for instance, to an undesirably high ratio of the resistances included in the negative feedback path which may translate into a limitation in the input signal dynamics.

SUMMARY

The description relates to negative impedance circuits.

Some embodiments provide improvements in negative impedance circuits.

One or more embodiments may be applied to various types of devices such as, for instance, read interfaces for ultrasound probes and the like.

Read interfaces for Piezoelectric Micro-machined Ultrasonic Transducers (PMUTs) are exemplary of a possible field of application of embodiments.

One or more embodiments may relate to a corresponding device.

A PMUT reading interface may be exemplary of such a device.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Also, throughout this description, certain circuit nodes and the signals at these nodes will be indicated with same reference ($V_x$, $V_{OUT}$) for simplicity and ease of explanation.

Figure 1:
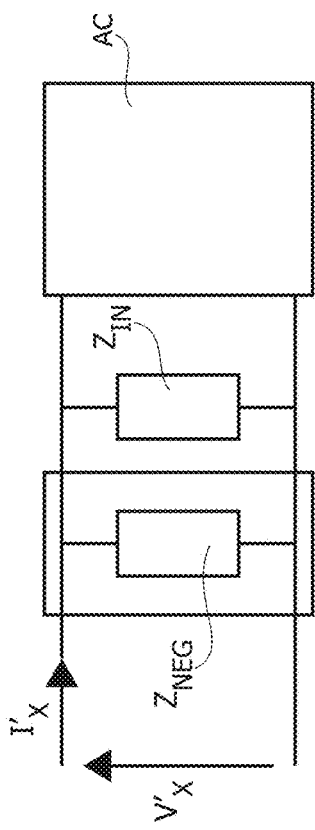
FIG. 1 is a diagram exemplary of a possible use of negative impedance circuits.

The diagram of FIG. 1 is exemplary of certain electronic devices wherein a circuit AC may exhibit a low input impedance $Z_{IN}$: this may be undesirable as possibly representing the source of various issues in device design and operation.

A known approach to address such issues involves coupling to the (low) impedance $Z_{IN}$ a "negative" impedance $Z_{NEG}$ ($-Z_{NEG}$) so that the input impedance $V'_X/I'_X$ "seen" towards the circuit AC may be expressed as $$Z_{IN,EQ} = V'_X/I'_X = Z_{NEG} Z_{IN}/(Z_{NEG} - Z_{IN})$$

In that way, an undesirably low impedance $Z_{IN}$ can be converted to a higher impedance value as a result of being multiplied by the ratio $Z_{NEG}/(Z_{NEG}-Z_{IN})$ with ($Z_{NEG}-Z_{IN}$) providing a small value for the denominator of the ratio $Z_{NEG}/(Z_{NEG}-Z_{IN})$.

Figure 2:
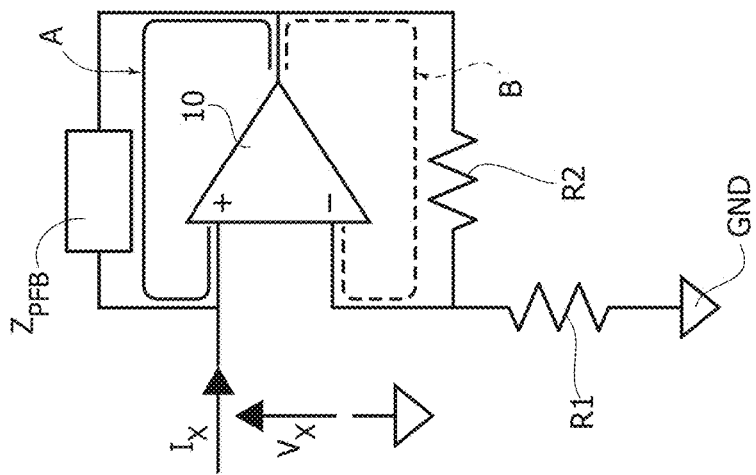
FIGS. 2 and 3 are circuits diagrams exemplary of negative impedance circuits.
Figure 3:
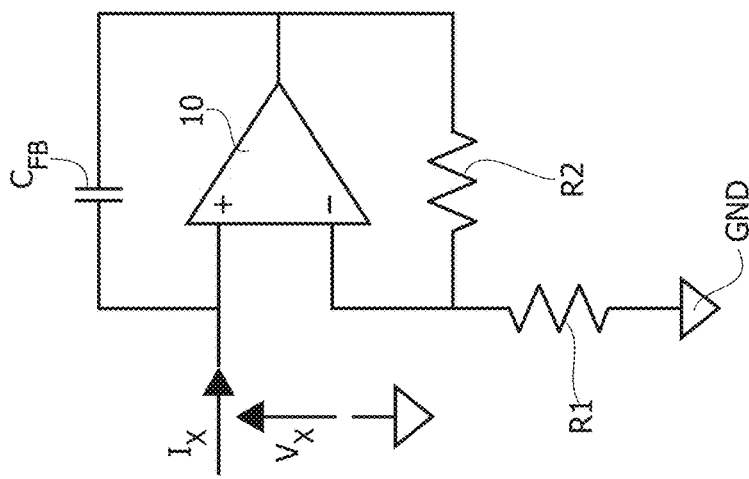

FIGS. 2 and 3 are exemplary of possible approaches in obtaining a negative impedance $Z_{NEG}=V_X/I_X$ by resorting to a differential stage 10 (an operational amplifier or opamp may be exemplary of such a differential stage) with the joint use of positive feedback (loop A—indicated with a continuous line) and negative feedback (loop B—indicated with a dashed line).

For instance, in an arrangement as exemplified in FIG. 2, the output terminal of the differential stage 10 is coupled via a feedback impedance $Z_{PFB}$ to the non-inverting input of the differential stage 10 (considered as the input node to the circuit, where input voltage $V_x$ and current $I_x$ are present) thus providing a positive feedback path A.

The output from the stage 10 is also coupled to the inverting input of the differential stage 10 via a voltage divider.

Such a voltage divider may be provided by a first resistor R1 (lower branch of the voltage divider, between the inverting input of the stage 10 and ground GND) and a second resistor R2 (upper branch of the voltage divider, between the output and the inverting input of the differential stage 10).

In an arrangement as exemplified in FIG. 2, the output voltage VOUT from the differential stage 10 can be expressed as $$V_{OUT}=(1+R2/R1)V_X$$

so that the negative impedance $Z_{NEG}=V_X/I_X$ can be expressed as:

$$Z_{NEG}=V_X/I_X=-Z_{PFB}(R1/R2)$$

FIG. 3 is exemplary of the possibility of implementing an arrangement as represented in FIG. 2 by using a capacitance $C_{FB}$ as the feedback impedance $Z_{PFB}$.

In an arrangement as exemplified in FIG. 3 the following relationships will apply:

$$Z_{NEG}=V_X/I_X=-(1/sC_{FB})(R1/R2)$$

where $s=j\omega$ ($\omega$=angular frequency) thus providing a negative input capacitance $C_{IN}$ which may be expressed as $$C_{IN}=-C_{FB}(R2/R1)$$

Implementing an arrangement as exemplified in FIG. 3 in order to provide a high negative capacitance in a process with low-density capacitors involves high values for the ratio R2/R1.

With $V_{OUT}=(1+R2/R1) V_X$, selecting a high value for R2/R1 leads to the dynamics of the signal $V_{OUT}$ being (much) higher than the dynamics for the input signal $V_X$. This in turn results in an undesired limitation in the input dynamics based on the relationship $$V_{X,MAX}=V_{OUT,MAX}/(1+R2/R1).$$

In embodiments as exemplified in FIG. 4, parts or elements like parts or elements already discussed in connection with the previous figures are indicated with like reference symbols, so that a detailed description will not be repeated for brevity.

Figure 4:
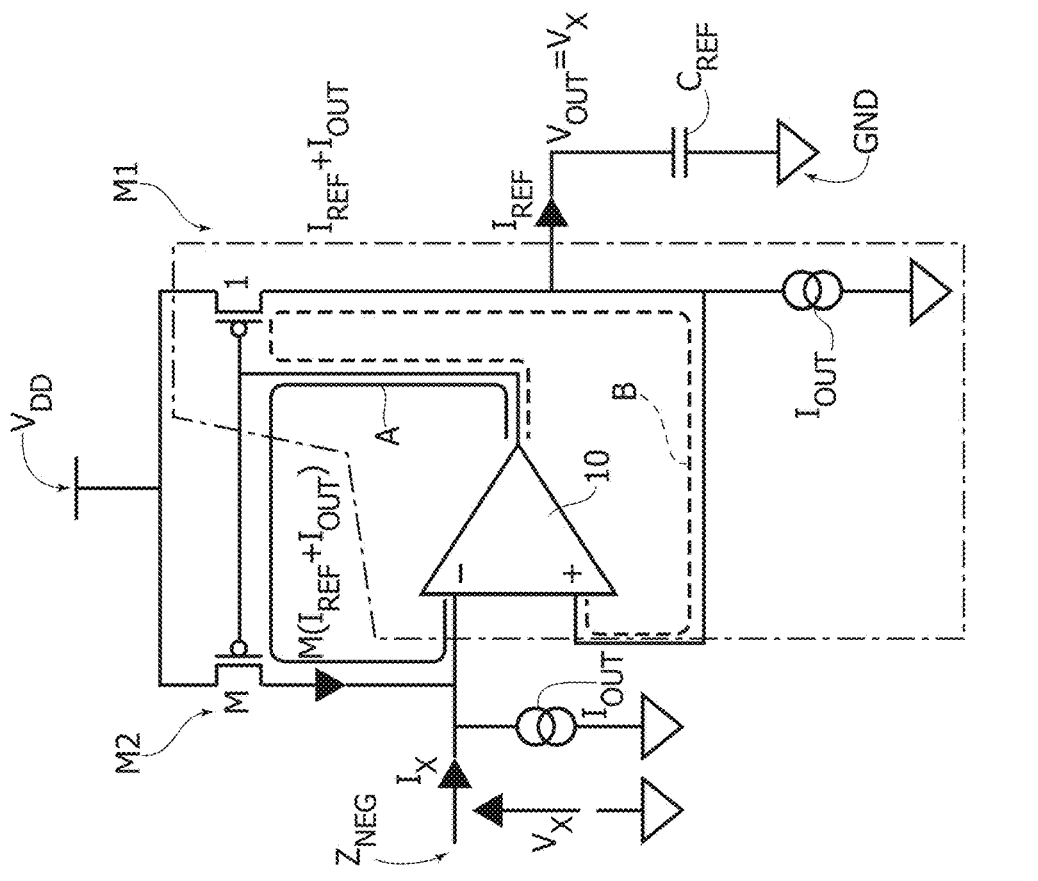
FIGS. 4 and 5 are circuit diagrams exemplary of negative impedance circuits of embodiments of the present description.

In one or more embodiments as generally exemplified in FIG. 4 the negative feedback path B from the output terminal of the differential stage 10 to the non-inverting input of the differential stage 10 is implemented without voltage amplification, that is with the output voltage of the differential stage 10, namely $V_{OUT}$, caused to be substantially equal to the input voltage $V_X$ to the circuit with a reference impedance $Z_{REF}$ between the inverting input of the differential stage 10 and ground GND.

For the sake of completeness and ease of understanding, in FIG. 4 (the same also applies to FIG. 5), current generators $I_{OUT}$ are also illustrated in order to show that, in embodiments as exemplified herein, an operational amplifier or OpAmp including two or more stages may be used where the triangle designated 10 can be regarded as exemplary of the first (differential) amplifier stage, while the transistor M1 and the respective current generator represent the output stage.

In embodiments as exemplified in FIG. 4 the (negative) feedback path B coupling the output terminal from the differential stage 10 to the non-inverting input of the differential stage 10 comprises a first transistor M1, and the (positive) feedback path A coupling the output terminal from the differential stage 10 to the inverting input of the differential stage 10 comprises a second transistor M2, the transistors M1 and M2, whose control electrodes (gates, in the case of field-effect transistors such as MOSFETs as exemplified herein) are included in a 1:M current mirror so that a current $I_{REF}$ flows through M1 and $Z_{REF}$ while the current $MI_{REF}$ through M2 corresponds to $-I_X$.

In an arrangement as exemplified in FIG. 4 (and the same may also apply to arrangements as exemplified in the following figures) a positive feedback path A may be provided which couples the output terminal from the differential stage 10 to the inverting input of the differential stage 10, while a negative feedback path B may be provided which couples the output terminal from the differential stage 10 to the non-inverting input of the differential stage 10. Such an arrangement takes into account the fact that, in arrangements as exemplified herein, output stages such as M1 (current $I_{OUT}$) in FIGS. 4 and 5, or 10A-10B in FIG. 6 are inverting stages.

That is, to provide a positive feedback, the differential stage 10 in FIGS. 4 and 5 and FIG. 6 (as discussed in the following) are shown with "reversed" inputs.

Those of skill in the art will appreciate that the coupling options to the inverting/non-inverting inputs of the differential stage 10 as exemplified herein are related to the inverting behavior of the associated output stages. Consequently, coupling options as exemplified herein are not per se mandatory; one or more embodiments may thus adopt different coupling options, for instance, complementary coupling options (inverting to non-inverting, non-inverting to inverting) in order to provide positive and negative feedback paths as desired.

In an arrangement as exemplified in FIG. 4, the transistors M1, M2 of the current mirror are exemplified in the form of MOSFETs having mutually-coupled control terminals (gates) jointly coupled to the output terminal of the differential stage 10.

As discussed, in an arrangement as exemplified in FIG. 4, the current paths (source/drain, in the case of field effect transistors such as MOSFETs) of the transistors M1 and M2 extend between a supply terminal $V_{DD}$ and the non-inverting and inverting inputs, respectively, to the differential stage 10 so that a current $I_{REF}$ flows through M1 and $Z_{REF}$, while the current $MI_{REF}$ through M2 corresponds to $-I_X$.

In an arrangement as exemplified in FIG. 4 the following relationships may apply:

$$I_{REF}=V_X/Z_{REF}$$

$$Z_{NEG}=V_X/I_X=-Z_{REF}/M$$

with again no input-output voltage amplification provided so that $V_{X,MAX}=V_{OUT,MAX}$.

Figure 5:
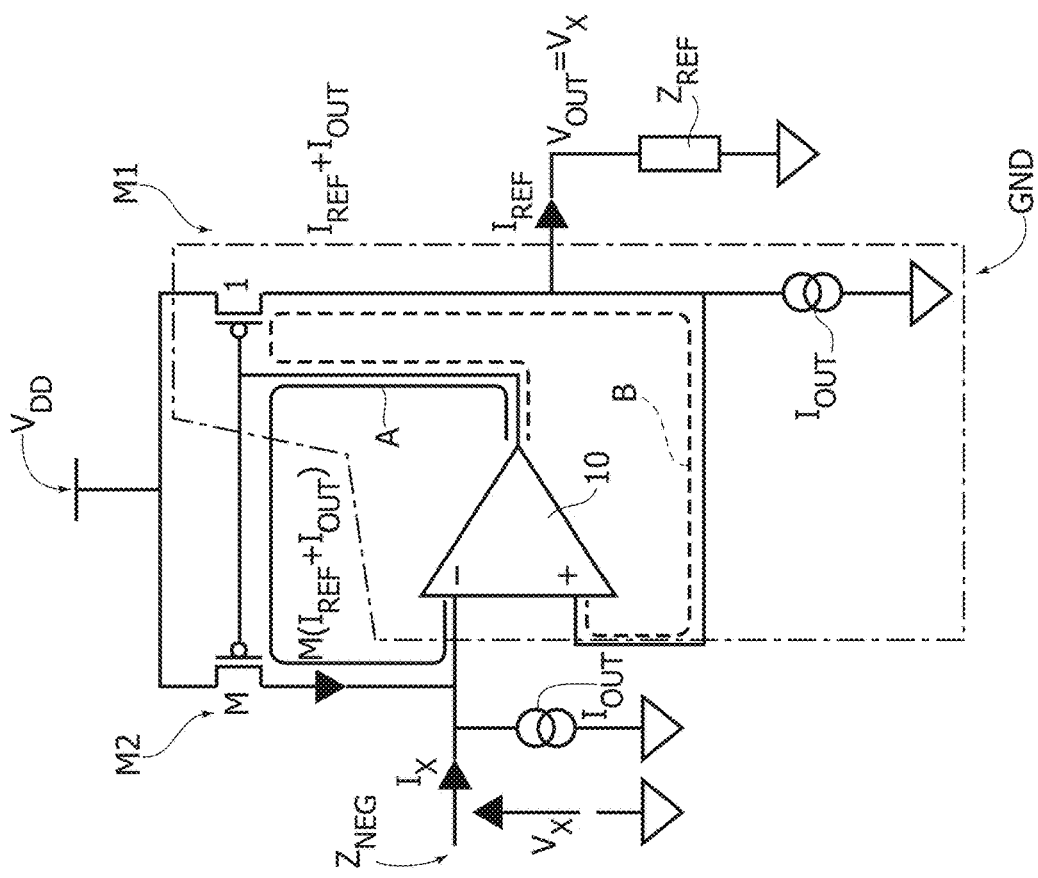
Figure 6:
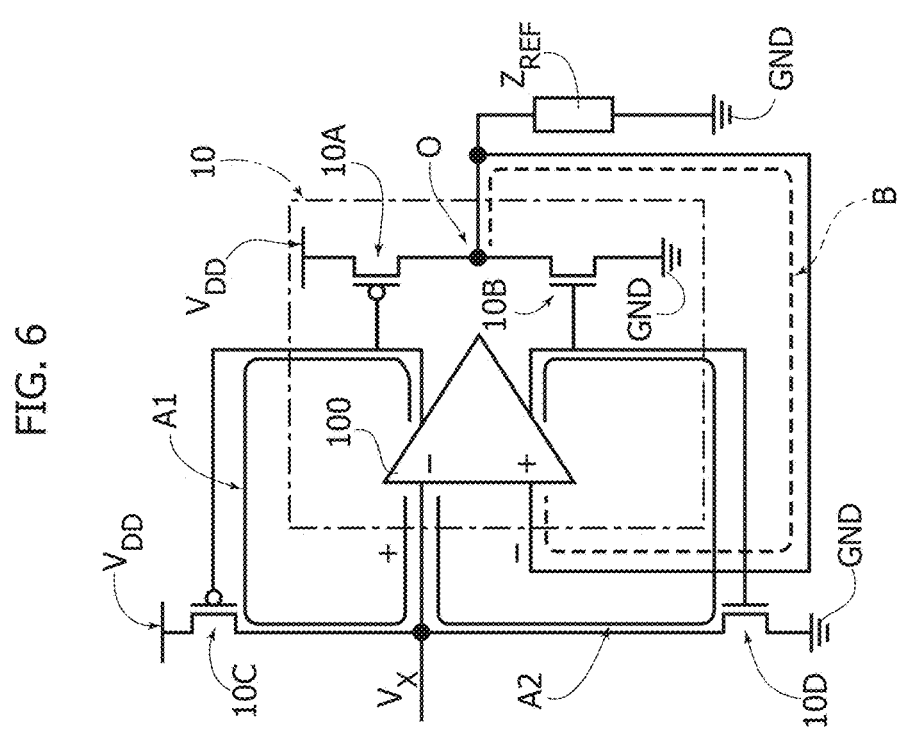

In FIG. 5, parts or elements like parts or elements already discussed in connection with the previous figures are again indicated with like symbols, so that a corresponding description will not be repeated for brevity.

FIG. 5 is exemplary of an arrangement where the general circuit exemplified in FIG. 4 is implemented by using a reference capacitance $C_{REF}$ as the reference impedance $Z_{REF}$ coupled between the non-inverting input of the differential stage 10 and ground GND.

In an arrangement as exemplified in FIG. 5, the following relationships may apply:

$$Z_{NEG}=V_X/I_X=-1/sC_{REF}M$$

$$C_{IN}=-C_{REF}M$$

where, again, $s=j\omega$ ($\omega$=angular frequency) and no voltage amplification is pursued so that $$V_{X,MAX}=V_{OUT,MAX}.$$

As discussed previously, FIGS. 4 and 5 are exemplary of embodiments which adopt an operational amplifier including two (or more) stages where the triangle designated 10 can be regarded as exemplary of a first (differential) amplifier stage, while the transistor M1 and the respective current generator represent a corresponding output stage.

Figure 7:
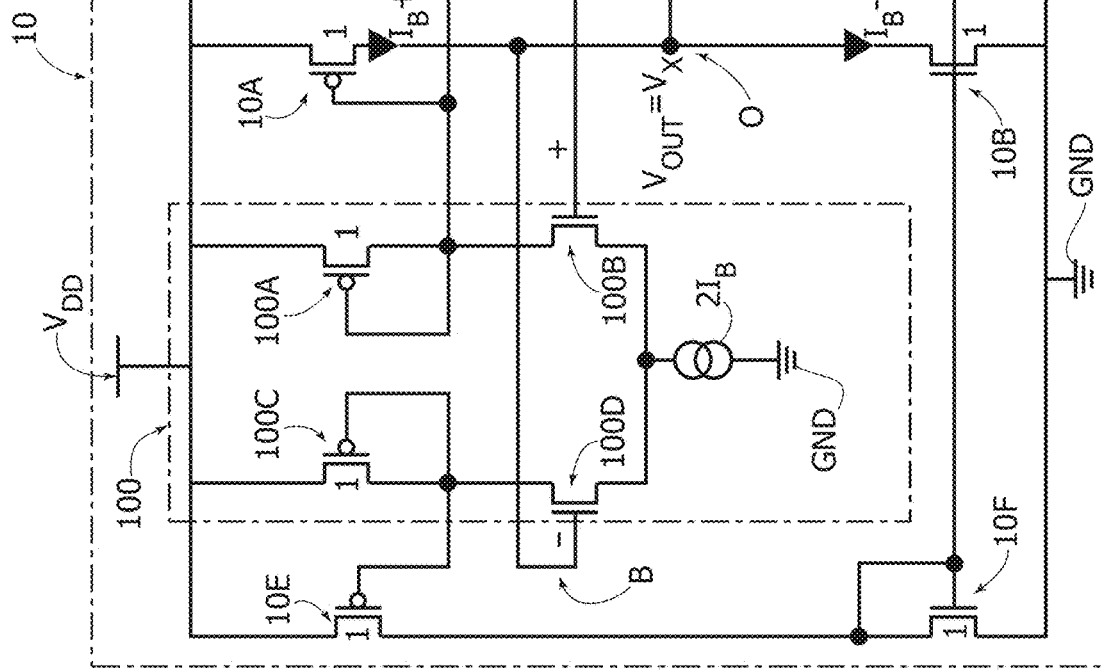
FIGS. 6 and 7 are circuit diagrams exemplary of possible transistor-level implementations of embodiments of the present description.

In FIGS. 6 and 7, parts or elements like parts or elements already discussed in connection with the previous figures are again indicated with like symbols, so that a corresponding description will not be repeated for brevity.

FIGS. 6 and 7 are exemplary of possible implementations wherein the reference impedance $Z_{REF}$ (this may include a reference capacitance $C_{REF}$: a generic impedance $Z_{REF}$ is shown in FIGS. 6 and 7 to provide a more comprehensive representation) is coupled to the negative feedback path B at an output node O from the differential stage 10 arranged intermediate two output transistors 10A, 10B (MOSFETs are again referred to as an example) having their current paths (source/drain, in the case of the field-effect transistors such as MOSFETs) cascaded between a supply node again designated $V_{DD}$ and ground GND.

As shown in FIGS. 6 and 7, the transistors 10A and 10B have their control terminals (gates, in the case of field-effect transistors such as MOSFETs as exemplified herein) coupled to respective outputs of an input stage 100 in a current mirror operational transconductance amplifier or OTA providing the differential core of the stage 10. The dual outputs of the differential input stage 100 are in phase (that is are identical in terms of AC component) while also providing a correct DC bias for the (MOSFET) transistors 10A and 10B.

For the sake of completeness one may note that the implementation of FIG. 6 includes a current mirror OTA with the (MOSFET) transistors 10A and 10B representing output transistors and the triangle 100 representing the differential input stage. Using such an amplifier to provide a negative impedance is a point of interest of some embodiments.

In embodiments as exemplified in FIGS. 6 and 7, the positive feedback path is split into two branches namely:

a first branch A1 from one of the output nodes of the differential input stage 100 to the control electrode of the transistor 10A and on to the non-inverting input ($V_x$, $I_x$) of the differential stage 10 (that is, to the inverting input of the differential input stage 100) via a first transistor 10C, and a second branch A2 from the other of the output nodes of the differential input stage 100 to the control electrode of the transistor 10B and on to the non-inverting input ($V_x$, $I_x$) of the differential stage 10 (that is to the inverting input of the differential input stage 100) via a second transistor 10D.

Splitting the positive feedback path A into two branches A1, A2 is related to the use of a current mirror OTA as exemplified herein. In some embodiments, this arrangement advantageously provides an appreciable improvement in terms of frequency response in comparison to implementations using, for instance, a standard two-stage OpAmp.

In some embodiments, an alternative approach that provides satisfactory bandwidth performance may involve using a two-stage OpAmp as exemplified in FIG. 4 and FIG. 5, with the circuit 10 and the (e.g. MOSFET) transistor M1 plus the generator $I_{OUT}$ as the input stage and the output stage, respectively.

As exemplified in FIGS. 6 and 7, the transistors 10C, 10D (MOSFETs are once more referred to by way of example) are arranged with their current paths (source/drain in the case of field-effect transistors such as MOSFETs) between, respectively:

the supply terminal $V_{DD}$ and the non-inverting input of the differential stage 10 (the inverting input of the differential input stage 100), that is the input node at which $V_x$ is applied, and the input node at which $V_x$ is applied, that is the non-inverting input to the differential stage 10 (the inverting input of the differential input stage 100), and ground GND.

In an arrangement as exemplified in FIG. 6, the transistors 10A and 10C (on the one hand) and transistors 10B and 10D (on the other hand) provide respective current mirror arrangements 10A, 10C and 10B, 10D just like the 1:M current mirror arrangements exemplified by the transistors M1 and M2 in the more general representations of FIGS. 4 and 5.

The transistor-level circuit representation of FIG. 7 further details a possible implementation of the differential input stage 100 (including four transistors 100A, 100B, 100C, 100D) and a tail current generator $2I_B$ with two current paths between the supply terminal $V_{DD}$ and ground GND via the current paths through transistors 100A, 100B and transistors 100C, 100D, respectively.

In FIG. 7, two further transistors 10E, 10F are shown (again MOSFETs are referred to for simplicity), the latter in a diode arrangement, so that—in a current mirror amplifier as considered herein—the transistors 100C, 10E and 10F mirror the current of the input transistor 100D into the output transistor 10D and the transistor 100A mirrors the current through the input transistor 100B into the output transistor 10C.

In FIG. 7, also currents $I_B+I_L/2$ and $I_B-I_L/2$ are shown flowing from the transistor 10A towards the node O and from the node O towards the transistor 10B, respectively.

These currents are mirrored by currents M ($I_B+I_L/2$) and M ($I_B-I_L/2$) flowing from the transistor 10C to the input node to which the voltage $V_X$ is applied and from that node towards the transistor 10D resulting in a current $MI_{REF}$ flowing at the input terminal $V_X$.

It will be appreciated that in FIG. 7 the current $MI_{REF}$ is represented (on the right hand-side of the figure) with an arrow pointing towards the outside of the node $V_X$, that is as a current flowing from the circuit in the presence of an assumed positive voltage $V_X$: this exemplifies the negative impedance behavior of the circuit exemplified (that is the negative impedance which may be "seen" at that node).

Those of skill in the art will again appreciate that the coupling options to the inverting/non-inverting inputs of the differential input stage 100 as exemplified herein are related to the inverting behavior of the associated output stages. Consequently, coupling options as exemplified herein are not per se mandatory; one or more embodiments may thus adopt different coupling options, for instance, complementary coupling options (inverting to non-inverting, non-inverting to inverting) in order to provide positive and negative feedback paths as desired.

Figure 8:
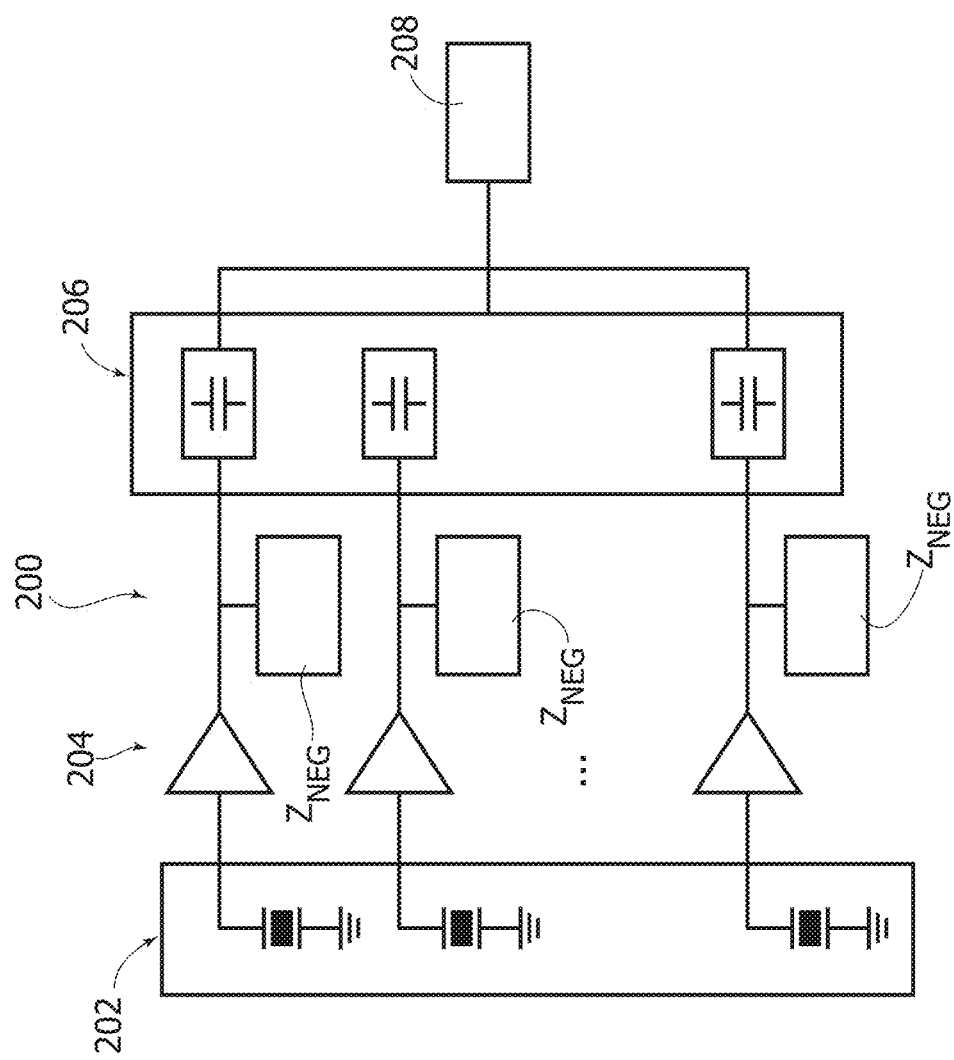
FIG. 8 is a block diagram exemplary of a possible use of embodiments as exemplified herein.

FIG. 8 is exemplary of a possible use of a plurality (in fact any number) of circuits providing a negative impedance $Z_{NEG}$ as exemplified in FIGS. 4 through 7 within the framework of a PMUT reading interface 200.

In FIG. 8, reference 202 denotes as a whole a PMUT array with the PMUTs in the array coupled to respective amplifiers 204 (low-noise amplifiers or LNAs, for instance) whose outputs are applied to respective analog delay circuits collectively designated 206 intended to perform a beamforming action and whose outputs are supplied to an adder 208 to provide an output signal as desired.

The general architecture of the interface 200 in FIG. 8 is per se known to those of skill in the art, which makes it unnecessary to provide a more detailed description herein.

In such interface architecture, each delay block in the set 206 can be regarded as a capacitive load to an associated LNA 204, with such a capacitive load possibly reducing the bandwidth of the LNA. Coupling between each LNA 204 and the associated delay block 206 a negative impedance $Z_{NEG}$ comprising a negative capacitance in parallel to the input capacitance of the delay block (see FIG. 1, for instance) will cause the negative capacitance to subtract from the input capacitance of the delay block and the resulting smaller capacitance will translate into increased LNA bandwidth.

Due to voltage amplification being dispensed with (namely with $V_{X,MAX}=V_{OUT,MAX}$ as exemplified herein) output signal dynamics will not be limited as may possibly happen in the case of conventional solutions.

In some embodiments, a circuit may comprise:

a differential circuit stage (see, for instance, 10, possibly including a differential input stage 100) having a first input (see, for instance, the non-inverting input of the stage 10 as possibly provided by the inverting input node of the differential input stage 100), a second input (see, for instance, the inverting input of the stage 10 as possibly provided by the non-inverting input node of the differential input stage 100) and an output (see, for instance, the output from the stage 10 as possibly provided as a dual output comprising the first and second output nodes of the differential input stage 100), at least one positive feedback path (for instance, A in FIGS. 4 and 5 or A1, A2 in FIGS. 6 and 7) from the output to the first input of the differential circuit stage, a negative feedback path (for instance, B) from the output to the second input of the differential circuit stage, wherein:

the negative feedback path comprises a unitary gain path from the output to the second input of the differential circuit stage, the unitary gain path coupled to ground (e.g., GND) via a reference impedance (for instance $Z_{REF}$ or $C_{REF}$), the negative feedback path and the at least one positive feedback path comprise a first transistor (for instance, M1 in FIGS. 4 and 5 or 10A, 10B in FIGS. 6 and 7) and a second transistor (for instance, M2 in FIGS. 4 and 5 or 10C, 10D in FIGS. 6 and 7), respectively, the first transistor and the second transistor having respective control electrodes (for instance gates, in the case of field-effect transistors such as MOSFETs) driven by the output of the differential circuit stage, the first transistor and the second transistor coupled in a current mirror arrangement, wherein a negative impedance (for instance, $Z_{NEG}$ or $C_{IN}$) is available at the first input (for instance $V_x$) of the differential circuit stage.

In some embodiments, the reference impedance may comprise a capacitive impedance (for instance, $C_{REF}$) wherein the negative impedance (for instance $C_{IN}$) available at the first input of the differential circuit stage (for instance, $V_x$) may comprise a negative capacitive impedance.

In some embodiments, the first transistor (for instance, M1 in FIGS. 4 and 5 or 10A, 10B in FIGS. 6 and 7) and the second transistor (for instance, M2 in FIGS. 4 and 5 or 10C, 10D in FIGS. 6 and 7) may be coupled in a current mirror arrangement having a current gain, M (for instance, with M higher than 1), from the first transistor to the second transistor.

In some embodiments:

the differential circuit stage may comprise a differential input stage (for instance, 100) having a first input node, a second input node and a dual output comprising a first output node and a second output node, a first positive feedback path (for instance, A1) may be provided from the first output node to the first input node of the differential input stage, a second positive feedback path (for instance, A2) may be provided from the second output node to the first input node of the differential input stage, the negative feedback path may be provided to the second input node of the differential input stage from a feedback node (for instance O) coupled to both the first output node and the second output node in the dual output of the differential input stage via respective first transistors in a pair of first transistors (for instance 10A, 10B in FIGS. 6 and 7), the first positive feedback path and the second positive feedback path may comprise respective second transistors in a pair of second transistors (for instance 10C, 10D in FIGS. 6 and 7), each of the first transistors in the pair of first transistors may be coupled in a current mirror arrangement to a respective one of the second transistors in the pair of second transistors (that is, for instance 10A with 10C and 10B with 10D) wherein a negative impedance is available at the first input node (for instance $V_x$) of the differential circuit stage.

In some embodiments, the transistors (for instance M1, M2 or 10A, 10B, 10C, 10D) may comprise MOSFETs.

In some embodiments, an electronic device (for instance, 200) may comprise:

at least one circuit block (for instance, 206) exhibiting an input impedance, at least one circuit as exemplified herein arranged with the first input (for instance, $V_x$) of the differential circuit stage coupled to said at least one circuit block wherein the input impedance is modified as a function of said negative impedance available at the first input of the differential circuit stage.

In some embodiments, the input impedance of the at least one circuit block and the negative impedance available at the first input of the differential circuit stage may comprise capacitive impedances.

In some embodiments, an electronic device as exemplified herein may comprise an ultrasonic transducer read interface comprising at least one (e.g., beamforming) circuit module (for instance, 206) having a input node configured to receive a ultrasonic transducer signal from an ultrasonic transducer (for instance, 202), with the at least one circuit arranged with the first input of the differential circuit stage coupled to said input node of the at least one circuit module.

Without prejudice to the underlying principles, the details and embodiments may vary, even significantly, with respect to what has been described herein by way of example only, without departing from the scope of protection.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A negative impedance circuit comprising:

a differential circuit stage having a first input, a second input and an output;

a positive feedback path from the output of the differential circuit stage to the first input of the differential circuit stage; and a negative feedback path from the output of the differential circuit stage to the second input of the differential circuit stage, wherein:

the negative feedback path comprises a first transistor, and a unitary gain path from the output of the differential circuit stage to the second input of the differential circuit stage, the unitary gain path coupled to ground via a reference impedance, the positive feedback path comprises a second transistor, the first transistor and the second transistor have respective control terminals configured to be driven by the output of the differential circuit stage, the first transistor and the second transistor coupled in a current mirror arrangement, and the negative impedance circuit is configured to cause a negative impedance at the first input of the differential circuit stage.

2. The negative impedance circuit of claim 1, further comprising a second positive feedback path from the output of the differential circuit stage to the first input of the differential circuit stage.

3. The negative impedance circuit of claim 2, wherein the differential circuit stage comprises a differential input stage having a first output coupled to the control terminal of the first transistor, and a second output coupled to a control terminal of a third transistor, the third transistor having a current path coupled between a current path of the first transistor and ground.

4. The negative impedance circuit of claim 3, further comprising a fourth transistor having a control terminal coupled to the control terminal of the third transistor, and a current path coupled between a current path of the second transistor and ground.

5. The negative impedance circuit of claim 4, wherein the differential input stage comprises:
   a fifth transistor having a control terminal coupled to a first intermediate node, the first intermediate node coupled between the current paths of the second and fourth transistors;
   a sixth transistor having a control terminal coupled to a second intermediate node, the second intermediate node coupled between the current paths of the first and third transistors; and
   a first current source coupled between the fifth and sixth transistors and ground.

6. The negative impedance circuit of claim 5, wherein the differential circuit stage further comprises:
   a seventh transistor having a control terminal coupled to the sixth transistor; and
   an eight transistor having a current path coupled between a current path of the seventh transistor and ground, and a control terminal coupled to the control terminal of the third transistor.

7. The negative impedance circuit of claim 1, wherein the reference impedance comprises a capacitive impedance, and wherein the negative impedance comprises a negative capacitive impedance.

8. The negative impedance circuit of claim 1, wherein the first transistor and the second transistor are coupled in a current mirror arrangement having a current gain, M, from the first transistor to the second transistor, wherein M is greater than 1.

9. The negative impedance circuit of claim 1, wherein:
   the differential circuit stage comprises a differential input stage having a first input node, a second input node, a first output node, and a second output node;
   the positive feedback path is provided from the first output node to the first input node of the input differential stage;
   a second positive feedback path is provided from the second output node to the first input node of the input differential stage;
   the negative feedback path is provided to the second input node of the input differential stage from a feedback node coupled to the first and second output nodes of the input differential stage via respective first transistors in a pair of first transistors;
   the positive feedback path and the second positive feedback path comprise respective second transistors in a pair of second transistors;
   each of the first transistors in the pair of first transistors is coupled in a current mirror arrangement to a respective one of the second transistors in the pair of second transistors; and
   the negative impedance is available at the first input node of the differential circuit stage.

10. The negative impedance circuit of claim 1, wherein the first and second transistors comprise metal-oxide-semiconductor field-effect transistor (MOSFETs).

11. An electronic device comprising:
    a circuit block exhibiting an input impedance; and
    a negative impedance circuit comprising:
       a differential circuit stage having a first input coupled to the circuit block, a second input and an output,
       a positive feedback path from the output of the differential circuit stage to the first input of the differential circuit stage, and
       a negative feedback path from the output of the differential circuit stage to the second input of the differential circuit stage, wherein:
       the negative feedback path comprises a first transistor, and a unitary gain path from the output of the differential circuit stage to the second input of the differential circuit stage, the unitary gain path coupled to ground via a reference impedance,
       the positive feedback path comprises a second transistor,
       the first transistor and the second transistor have respective control electrodes configured to be driven by the output of the differential circuit stage, the first transistor and the second transistor coupled in a current mirror arrangement, and
       the negative impedance circuit is configured to cause a negative impedance at the first input of the differential circuit stage that is configured to modify the input impedance of the circuit block.

12. The electronic device of claim 11, wherein the input impedance of the circuit block and the negative impedance at the first input of the differential circuit stage comprise capacitive impedances.

13. The electronic device of claim 11, further comprising an ultrasonic transducer read interface comprising the circuit block, wherein the circuit block has an input configured to receive an ultrasonic transducer signal from an ultrasonic transducer, and wherein the first input of the differential circuit stage is coupled to the input of the circuit block.

14. The electronic device of claim 13, wherein the ultrasonic transducer comprises a Piezoelectric Micro-machined Ultrasonic Transducer (PMUT).

15. The electronic device of claim 11, further comprising a second circuit block and a second negative impedance circuit, wherein the circuit block has an input coupled to the first input of the differential circuit stage and an output coupled to an adder, and wherein the second circuit block has an input coupled to the second negative impedance circuit, and an output coupled to the adder.

16. A method comprising:
    driving a control node of a first transistor of a negative feedback path with an output of a differential circuit stage, wherein the negative feedback path is coupled from an output of a differential circuit stage to a second input of the differential circuit stage, and wherein the negative feedback path comprises a unitary gain path from the output of the differential circuit stage to the second input of the differential circuit stage, the unitary gain path coupled to ground via a reference impedance;

a driving a control node of a second transistor of a positive feedback path with the output of the differential circuit stage, wherein the positive feedback path is coupled from the output of the differential circuit stage to a first input of the differential circuit stage, and wherein the first transistor and the second transistor are coupled in a current mirror arrangement; and generating a negative impedance at the first input of the differential circuit stage based on the driving the control nodes of the first and second transistors to modify an input impedance at an input of a circuit block, wherein the first input of the differential circuit stage is coupled to the input of the circuit block.

17. The method of claim 16, further comprising driving a control node of a third transistor of a second positive feedback path with the differential circuit stage, wherein the second positive feedback path is coupled to the first input of the differential circuit stage.

18. The method of claim 16, wherein the reference impedance comprises a capacitive impedance, and wherein the negative impedance comprises a negative capacitive impedance.

19. The method of claim 16, further comprising receiving an ultrasonic transducer signal from an ultrasonic transducer with the input of the circuit block.

20. The method of claim 19, wherein the ultrasonic transducer comprises a Piezoelectric Micro-machined Ultrasonic Transducer (PMUT).

* * * * *